(12) United States Patent
Jang et al.

(10) Patent No.: US 10,666,207 B1
(45) Date of Patent: May 26, 2020

(54) BROADBAND HARMONIC MATCHING NETWORK USING LOW-PASS TYPE BROADBAND MATCHING

(71) Applicant: Cree, Inc., Durham, NC (US)

(72) Inventors: Haedong Jang, San Jose, CA (US); Richard Wilson, Morgan Hill, CA (US); Björn Herrmann, San Jose, CA (US); Zulhazmi Mokhti, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/193,884

(22) Filed: Nov. 16, 2018

(51) Int. Cl.
| | |
|---|---|
| *H03F 3/191* | (2006.01) |
| *H03F 3/60* | (2006.01) |
| *H03F 3/24* | (2006.01) |
| *H03F 3/217* | (2006.01) |
| *H03F 1/56* | (2006.01) |
| *H03F 3/19* | (2006.01) |

(Continued)

(52) U.S. Cl.
CPC ............... *H03F 1/565* (2013.01); *H03F 3/19* (2013.01); *H03H 7/18* (2013.01); *H03F 2200/222* (2013.01); *H03F 2200/451* (2013.01); *H04B 1/16* (2013.01)

(58) Field of Classification Search
USPC ........................................ 330/302, 305, 250
See application file for complete search history.

(56) References Cited

U.S. PATENT DOCUMENTS

| | | | |
|---|---|---|---|
| 9,337,784 B2 * | 5/2016 | Kim, II | .................... H03F 3/193 |
| 10,122,336 B1 | 11/2018 | Jang et al. | |
| 10,541,653 B2 * | 1/2020 | Zhu | ......................... H01L 24/48 |

(Continued)

OTHER PUBLICATIONS

Pang, J. et al., "A Post-Matching Doherty Power Amplifier Employing Low-Order Impedance Inverters for Broadband Applications", IEEE Transactions on Microwave Theory and Techniques, Dec. 2015, pp. 4061-4071, vol. 63, No. 12.

(Continued)

*Primary Examiner* — Hieu P Nguyen
(74) *Attorney, Agent, or Firm* — Coats & Bennett, PLLC

(57) ABSTRACT

The operative bandwidth of a broadband RF amplifier is improved by using a low-pass type broadband impedance transformer, instead of a broadband matching network, in a multi-stage impedance matching network connected, e.g., to the amplifier input. The multi-stage impedance matching network comprises three stages connected in series. The first stage is a low-pass type broadband impedance transformer that provides broadband fundamental impedances and high reflection for the second harmonics. The second stage is a phase shifter that controls the location of the second harmonic reflection coefficient phases. The third stage is a high-pass input matching circuit that transforms the complex conjugate device input impedance to a real impedance. The three-stage impedance matching network provides the fundamental and harmonic frequency impedances for broadband operations, as well as controllability of the second harmonic reflection coefficient phases where the device performances are consistent across the intended bandwidth. The multi-stage impedance matching network may be connected to the input of an RF amplifier, the output, or both.

22 Claims, 20 Drawing Sheets

(51) Int. Cl.
    *H03H 7/18*     (2006.01)
    *H04B 1/16*     (2006.01)

(56) References Cited

U.S. PATENT DOCUMENTS

| | | |
|---|---|---|
| 2004/0051589 A1 | 3/2004 | Cohta et al. |
| 2009/0039962 A1 | 2/2009 | Uno et al. |
| 2015/0280685 A1 | 10/2015 | Goumas et al. |
| 2019/0393843 A1* | 12/2019 | Tango ................ H03F 3/24 |

OTHER PUBLICATIONS

Pednekar, P. et al, "RF-Input Load Modulated Balanced Amplifier with Octave Bandwidth", IEEE Transactions on Microwave Theory and Techniques, Dec. 2017, pp. 5181-5191, vol. 65, No. 12.

Chen, K., et al., "Design of Highly Efficient Broadband Class-E Power Amplifier Using Synthesized Low-Pass Matching Networks", IEEE Transactions on Microwave Theory and Techniques, Dec. 2011, pp. 3162-3173, vol. 59, No. 12.

Tan, J. et al., "Design of a High Power, Wideband Power Amplifier Using AlGaN/GaN Hemt", IEEE Wireless and Microwave Technology Conference, Apr. 2017, pp. 1-4.

\* cited by examiner

------- freq (2.100GHz to 2.700GHz)
——— freq (4.200GHz to 5.400GHz)
RFfreq (2100000000.000 to 2700000000.000)

BROADBAND HARMONIC MATCHING NETWORK USING LOW-PASS TYPE BROADBAND MATCHING

FIELD OF INVENTION

The present invention relates generally to Radio Frequency (RF) circuits, and in particular to a low-pass broadband impedance matching circuit for broadband RF amplifiers.

BACKGROUND

Radio Frequency (RF) power amplifiers are an important part of wireless communication circuits. High power RF amplifiers are particularly important in wireless communication networks, such as for example in a base station providing wireless transmissions over a large geographic area. To communicate a greater volume and variety of content, e.g., video, wireless communications operate over increasingly broad frequency bands.

Broadband power amplifiers are of high interest in this regard. Broadband power amplifiers can support high data rate communications through wider bandwidth without the need for multiple amplifiers. Also, the small form factor of a single broadband amplifier, compared to using multiple power amplifiers for multiple bands, saves space and power, simplifies circuit layout and routing, and is otherwise beneficial. However, the optimal input and output impedances of power devices such as high electron mobility transistors (HEMT) must be matched to system impedance, which is typically 50Ω.

Impedance matching networks are frequency selective and introduce impedance dispersion versus frequency, resulting in band-limited power amplifier operation. Also, the harmonic impedances presented to devices significantly affect the device performance, and frequency dispersion results in degraded performance at a certain frequency ranges. Therefore smaller impedance dispersion of the matching networks versus frequency, and the capability of matching the optimal impedance variation range, are desirable for broadband amplifier operation.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Performance of a broadband RF amplifier depends not only on the fundamental impedances, but also on the second harmonic impedances, presented to the amplifier input. According to embodiments of the present invention described and claimed herein, the operative bandwidth of a broadband RF amplifier is improved by using a low-pass type broadband impedance transformer, instead of a broadband matching network, in a multi-stage impedance matching network connected, e.g., to the amplifier input. In embodiments of the present invention, an impedance matching network comprises three stages connected in series. The first stage is a low-pass type broadband impedance transformer that provides broadband fundamental impedances and high reflection for the second harmonics. The second stage is a phase shifter transmission line (or a lumped version of the transmission line) that controls the location of the second harmonic reflection coefficient phases for the broadband operation. The third stage is a high-pass input matching circuit that transforms the complex conjugate device input impedance to a real impedance, while transferring the higher harmonic components to next stages. The three-stage impedance matching network provides the fundamental and harmonic frequency impedances for broadband operations, as well as controllability of the second harmonic reflection coefficient phases where the device performances are consistent across the intended bandwidth as well as the broadband fundamental impedances.

One embodiment relates to broadband Radio Frequency (RF) amplifier circuit configured to amplify an RF signal received from a source, across an RF frequency band that includes a fundamental frequency band. The RF amplifier circuit includes an amplifying circuit. The RF amplifier circuit also includes a multi-stage broadband impedance matching circuit at an input of the amplifying circuit. The multi-stage broadband impedance matching circuit includes a low-pass broadband impedance matching network presenting a low input reflection to the RF source at the fundamental frequency band and a high input reflection to the RF source at a second harmonic of the fundamental frequency band. The multi-stage broadband impedance matching circuit also includes a phase shifting circuit configured to pass the RF signal at the fundamental frequency band, and to shift the phase of the RF signal at the second harmonic of the fundamental frequency band. The multi-stage broadband impedance matching circuit further includes an impedance matching circuit configured to transform the complex conjugate amplifying circuit input impedance to a real impedance.

Another embodiment relates to a broadband Radio Frequency (RF) amplifier circuit configured to amplify an RF signal across an RF frequency band that includes a fundamental frequency band, and to output an amplified RF signal. The RF amplifier circuit includes an amplifying circuit and a multi-stage broadband impedance matching circuit at an output of the amplifying circuit. The multi-stage broadband impedance matching circuit includes an impedance matching circuit connected to the output of the amplifying circuit and configured to transform a complex conjugate amplifying circuit input impedance to a real impedance; a phase shifting circuit configured to pass the amplified RF signal at the fundamental frequency band, and to shift the phase of the amplified RF signal at the second harmonic of the fundamental frequency band; and a low-pass broadband impedance matching network presenting a low input reflection at the fundamental frequency band and a high input reflection at a second harmonic of the fundamental frequency band.

Yet another embodiment relates to a multi-stage broadband impedance matching circuit for a broadband Radio Frequency (RF) amplifier. The multi-stage broadband impedance matching circuit includes a low-pass broadband impedance matching network presenting a low input reflection to the RF source at the fundamental frequency band and a high input reflection to the RF source at a second harmonic of the fundamental frequency band. The multi-stage broadband impedance matching circuit also includes a phase shifting circuit configured to pass the RF signal at the fundamental frequency band, and to shift the phase of the RF signal at the second harmonic of the fundamental frequency band. The multi-stage broadband impedance matching circuit further includes an impedance matching circuit configured to transform the complex conjugate amplifying circuit input impedance to a real impedance.

Still another embodiment relates to a method of operating a broadband Radio Frequency (RF) amplifier. An RF signal to be amplified is received from a source. The RF signal covers a fundamental frequency band. A low input reflection is presented to the source at the fundamental frequency band, and a high input reflection is presented at a second harmonic of the fundamental frequency band. The fundamental frequency band is passed, and the phase of the second harmonic of the fundamental frequency band is shifted. A complex conjugate RF amplifier impedance is transformed to a real impedance. The RF signal is amplified.

Still another embodiment relates to a method of operating a broadband Radio Frequency (RF) amplifier. An RF signal is amplified. A complex conjugate RF amplifier output impedance is transformed to a real impedance. The fundamental frequency band of an amplified RF signal is passed, and the phase of the second harmonic of the fundamental frequency band of the amplified RF signal is shifted. A low input reflection at the fundamental frequency band and a high input reflection at a second harmonic of the fundamental frequency band is presented to circuits or components receiving the amplified RF signal.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1A:
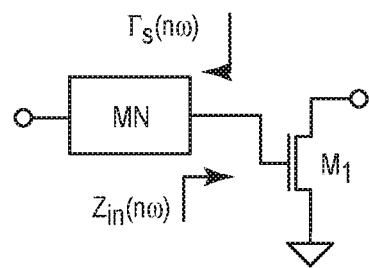
FIG. 1A is a block diagram of an amplifier and impedance matching network.

FIG. 1A depicts an input matching network (MN) for a power device ($M_1$), such as a broadband RF amplifier. The device has given input impedances ($Z_{in}$) at each harmonic frequency at its optimal operating conditions. In FIG. 1A, 'n' represents the harmonic number, i.e., '1' is the fundamental component, '2' is the second harmonic, and so on. The symbol 'ω' represents the angular frequency where the design is concerned. The matching network transforms the system impedance (e.g., 50Ω) to the complex conjugate of the device input impedances. However, the impedance transformation is typically satisfactory only in limited frequency range. The implemented matching network presents the source impedance or source reflection coefficients to the input of the device at each frequency, including harmonics. The reflection coefficients can be normalized to a certain reference impedance.

Figure 1B:
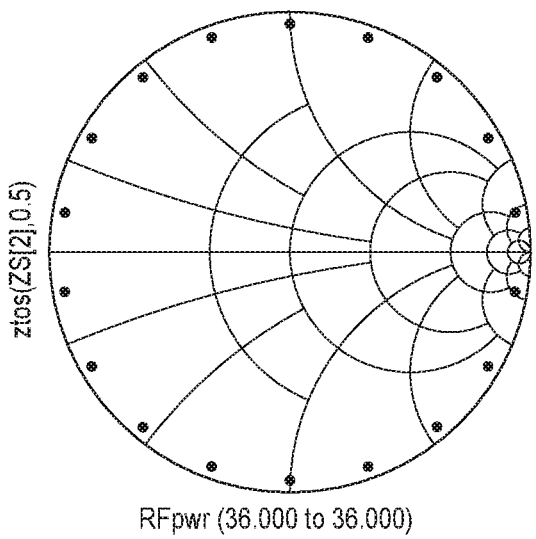
FIG. 1B is a Smith chart plotting second harmonic reflection coefficient phases.
Figure 1C:
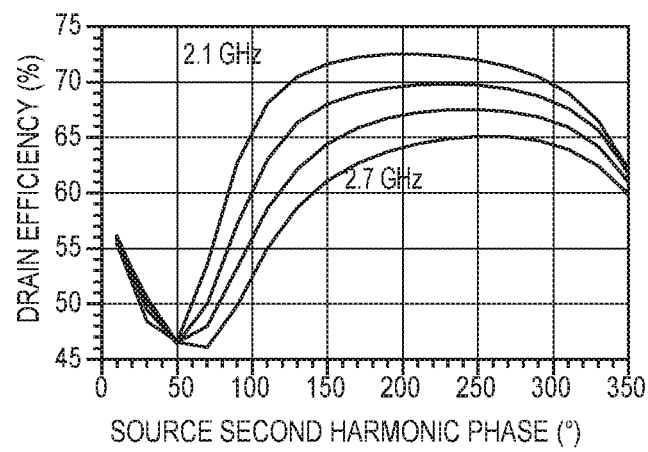
FIG. 1C is a graph of drain efficiency as a function of source second harmonic reflection coefficients over a first frequency range.

FIG. 1B is a Smith chart depicting the second harmonic reflection coefficient phases, as an RF source is swept through various frequencies from 2.1 GHz to 2.7 GHz, with 0.2 GHz step. FIG. 1C depicts the efficiency performance variations versus the source second harmonic reflection coefficient phases presented to the device at the various frequencies. The magnitude of the source reflection coefficient was assumed to be constant, i.e., 0.95 normalized to 0.5Ω. The RF amplifier output impedance matching networks were fixed and this disclosure focuses on the source impedance effects. However, those of skill in the art will readily recognize that the disclosed circuits and method can be applied to the output matching networks as well, without limitation. It is apparent that the drain efficiency drastically varies versus the source second harmonic reflection coefficient phases and frequencies. The characteristics of the device M1 require an input matching network MN whose frequency response, in terms of the source reflection coefficient at the second harmonic frequency, presents a certain range of phases in order to obtain consistent performance versus frequency, with minimal variation, for broadband operation.

Figure 2A:
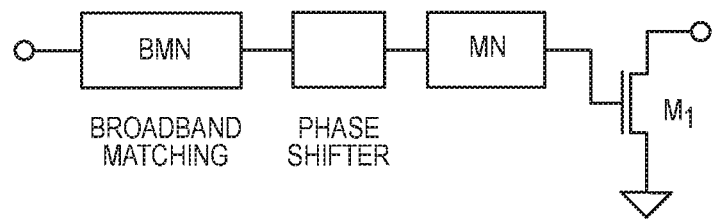
FIG. 2A is a block diagram of a multi-stage impedance matching network utilizing a broadband matching network BMN.
Figure 2B:
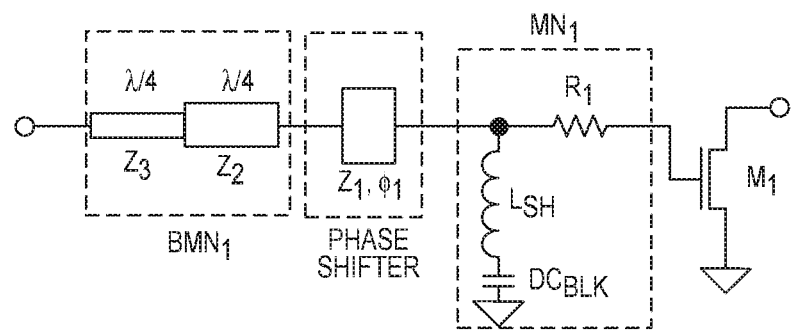
FIG. 2B is a schematic diagram of the multi-stage impedance matching network of FIG. 2A.
Figure 2C:
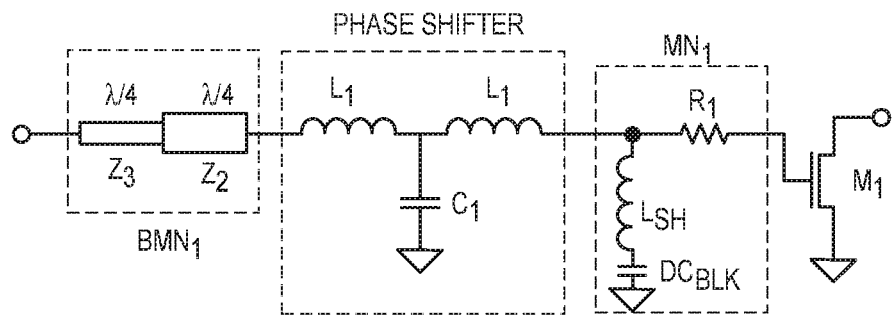
FIG. 2C is a schematic diagram of the multi-stage impedance matching network of FIG. 2A depicting the phase shifter as lumped elements.

Toward this end, it is known to utilize a multi-stage impedance matching network at the RF amplifier input. As depicted in FIG. 2A, the multi-stage impedance matching network includes a broadband matching network (BMN), a phase shifter, and an additional matching network (MN). The BMN may be implemented using a two-stage quarter wavelength impedance transformer, as illustrated in FIGS. 2B and 2C. The phase shifter may be implemented as a transmission line, as depicted in FIG. 2B, or a lumped element version of the transmission line with a certain cut-off frequency, as depicted in FIG. 2C. The final impedance matching network MN is a high-pass type impedance matching network using a shut inductor. The multi-stage impedance matching network of FIG. 2 has a characteristic operational frequency range, and its performance degrades beyond this frequency range.

Figure 3A:
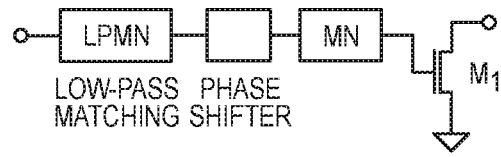
FIG. 3A is a block diagram of a multi-stage impedance matching network utilizing a low-pass broadband matching network LPMN.
Figure 3B:
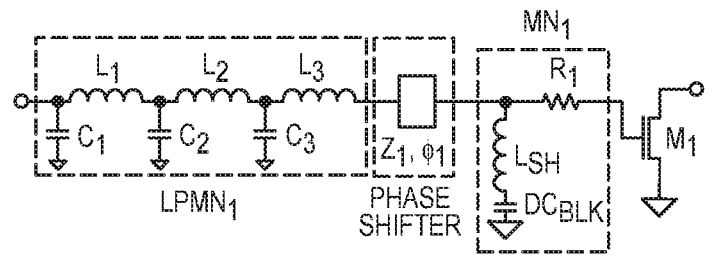
FIG. 3B is a schematic diagram of the multi-stage impedance matching network of FIG. 3A depicting the LPMN as lumped elements, the phase shifter as a transmission line, and the matching network as a shunt inductor.
Figure 3C:
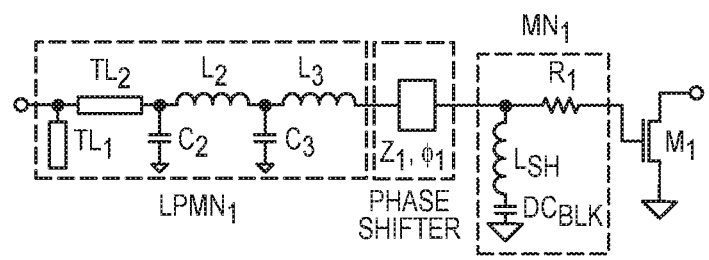
FIG. 3C is a schematic diagram of the multi-stage impedance matching network of FIG. 3A depicting part of the LPMN as distributed elements, the phase shifter as a transmission line, and the matching network as a shunt inductor.
Figure 3D:
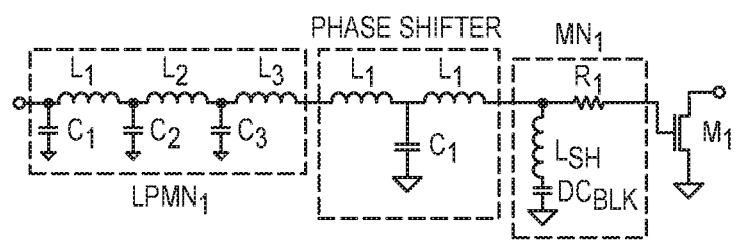
FIG. 3D is a schematic diagram of the multi-stage impedance matching network of FIG. 3A depicting the LPMN as lumped elements, the phase shifter as lumped elements, and the matching network as a shunt inductor.
Figure 3E:
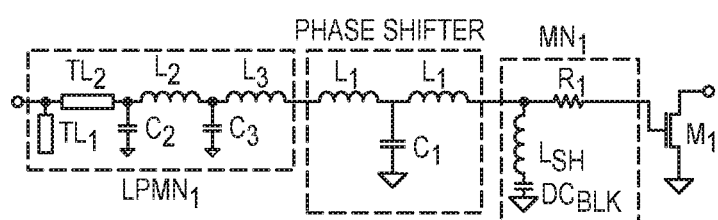
FIG. 3E is a schematic diagram of the multi-stage impedance matching network of FIG. 3A depicting part of the LPMN as distributed elements, the phase shifter as lumped elements, and the matching network as a shunt inductor.

According to embodiments of the present invention, the multi-stage impedance matching network of FIG. 2 is improved by use of a low-pass type broadband matching network (LPMN), as depicted in FIG. 3A, instead of the broadband matching network BMN of FIG. 2A. In one embodiment, the low-pass type broadband matching network LPMN is implemented using lumped inductors and capacitors, as depicted in FIG. 3B. In another embodiment, it is implemented using distributed elements instead of the lumped elements, at least in some parts, as depicted in FIG. 3C. FIG. 3D depicts the low-pass type broadband matching network LPMN with the phase shifter implemented as a lumped version of a transmission line. FIG. 3E depicts the low-pass type broadband matching network LPMN implemented using distributed elements in at least some parts, and the phase shifter implemented as a lumped element version of the transmission line with a certain cut-off frequency. In all four embodiments (FIGS. 2B-E), the high-pass type impedance matching network MN is implemented using a shut inductor.

Figure 4A:
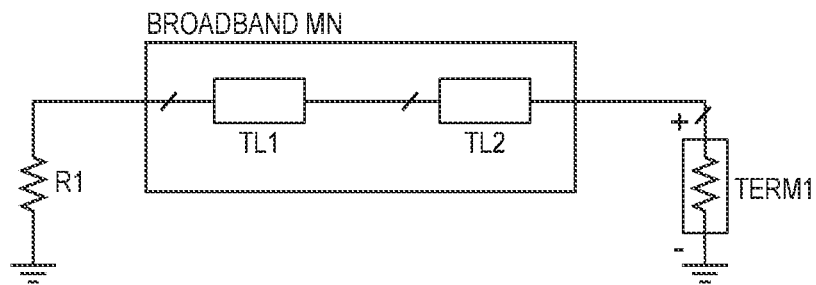
FIG. 4A is a block diagram of a broadband matching network BMN as a two-stage quarter wavelength transmission line.
Figure 4B:
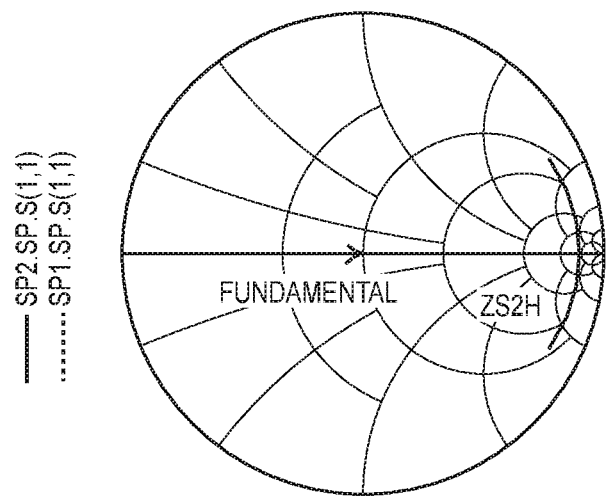
FIG. 4B is a Smith chart plotting the frequency response of the BMN of FIG. 4A in terms of reflection coefficients.
Figure 4C:
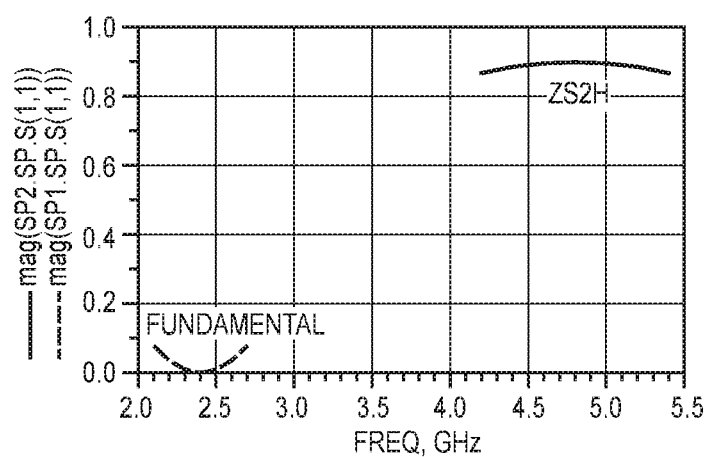
FIG. 4C is a graph of the magnitudes of the reflection coefficients of FIG. 4B at the fundamental and second harmonic frequencies.

The operation of the known multi-stage impedance matching network with the broadband matching network BMN of FIG. 2A is briefly discussed, to place the inventive low-pass type broadband matching network LPMN in context. Typically, RF power amplifiers have low input and output optimal impedances, due to the large device periphery. The first stage of the multi-stage impedance matching network transforms the system impedance of 50Ω to a low impedance, using a two-stage broadband impedance matching circuit BMN as depicted in FIG. 4A. The reflection coefficients, seen from the low impedance port, are plotted on a Smith chart in FIG. 4B. The fundamental frequency response is well centered due to the broadband impedance transformer. The magnitude of the reflection coefficients is plotted versus frequency in FIG. 4C, with the fundamental frequency centered at 2.4 GHz, and the second harmonic frequencies centered at about 4.8 GHz. As this graph shows, the reflections coefficients are very low in the fundamental frequency band, approaching 0 at 2.4 GHz. On the other hand, the reflection coefficients at the second harmonic frequency (ZS2H), centered around 4.7 GHz, are very high. This is because the quarter wave length transformer has a half wavelength at the second harmonic frequency, maintaining the system impedance of 50Ω in this frequency band. Due to the low input impedance of the amplifier, the frequency response is highly reflective.

Figure 5A:
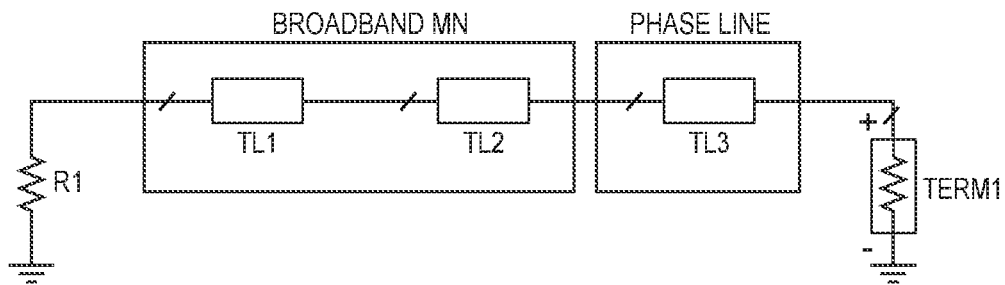
FIG. 5A is a block diagram of a broadband matching network BMN as a two-stage quarter wavelength transmission line with a phase shifter implemented as a transmission line.
Figure 5B:
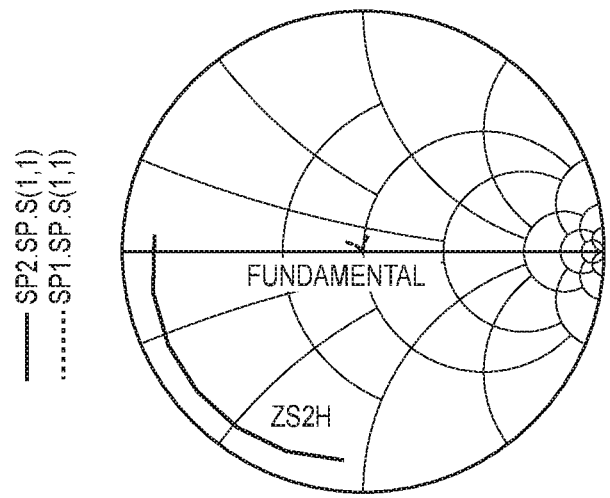
FIG. 5B is a Smith chart plotting the frequency response of the circuit of FIG. 5A in terms of reflection coefficients.
Figure 5C:
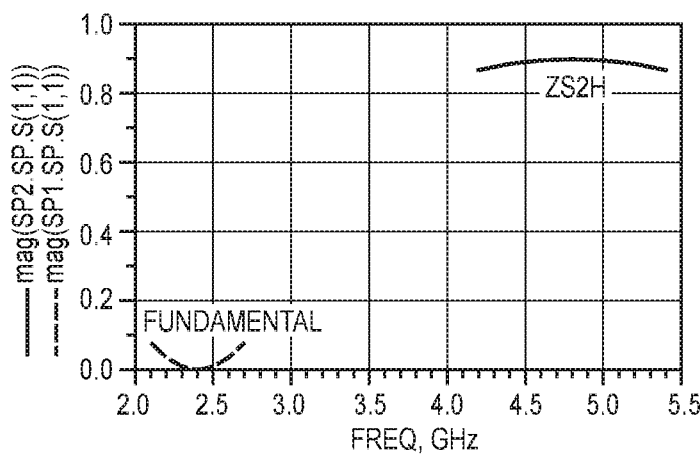
FIG. 5C is a graph of the magnitudes of reflection coefficients of FIG. 5B at the fundamental and second harmonic frequencies.

The circuit depicted in FIG. 5A adds a phase shifter to the output of the broadband matching network BMN. The phase shifter has the same characteristic impedance as the low impedance port of BMN (i.e., it is impedance-matched). Therefore, it has wideband characteristics at the fundamental frequency band while it shifts the second harmonic frequency bands, as depicted by the reflection coefficients in FIG. 5B. By adjusting the electrical length of the phase shifter, the second harmonic source reflection coefficient phases can be determined, while maintaining the same magnitude. FIG. 5C depicts the magnitudes of reflection coefficients versus frequency, and is very similar to the plot of FIG. 4C. The phase shifter may be implemented either using a transmission line or a lumped version of the transmission line, as depicted in FIGS. 2B and 2C.

Figure 6A:
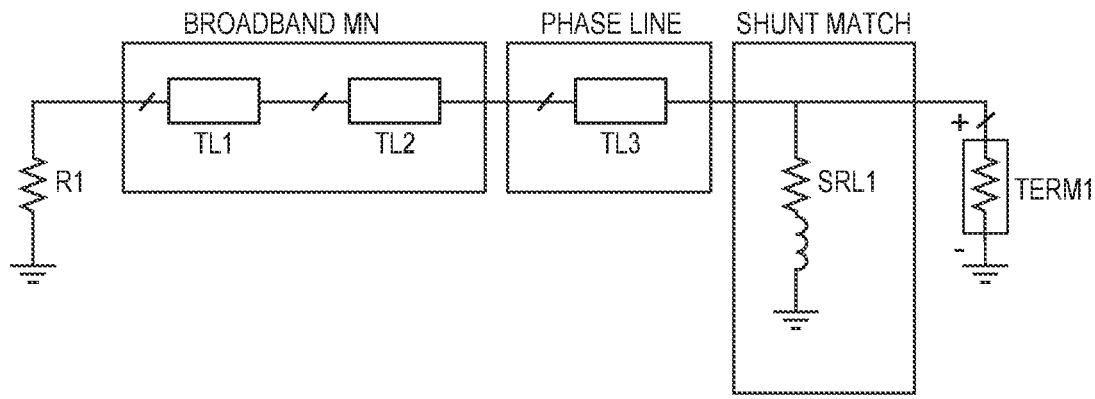
FIG. 6A is a block diagram of a multi-stage impedance matching network implemented as a broadband matching network BMN with a phase shifter and a shunt impedance matching circuit.
Figure 6B:
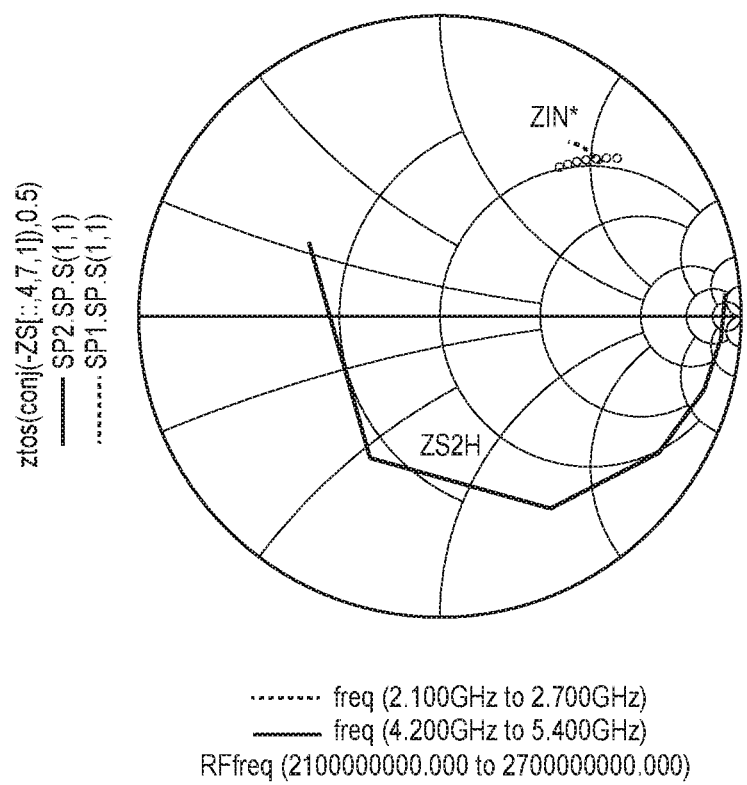
FIG. 6B is a Smith chart plotting the frequency response of the circuit of FIG. 6A over a first frequency range, in terms of reflection coefficients.

FIG. 6A adds the additional matching network MN, implemented as a shunt inductor, to match the complex conjugate of the RF amplifier input impedance. The complex conjugates of the amplifier input impedance at difference power levels, with varied load conditions, are shown as circles in FIG. 6B, denoted Zin*. The fundamental frequency band response seen from the amplifier is shown as the dashed line near these circles. The second harmonic frequency band response is labeled ZS2H. By altering the electrical length of the phase line, the second harmonic reflection coefficient phases can be located as desired in the high performance region of FIG. 1C.

Figure 7A:
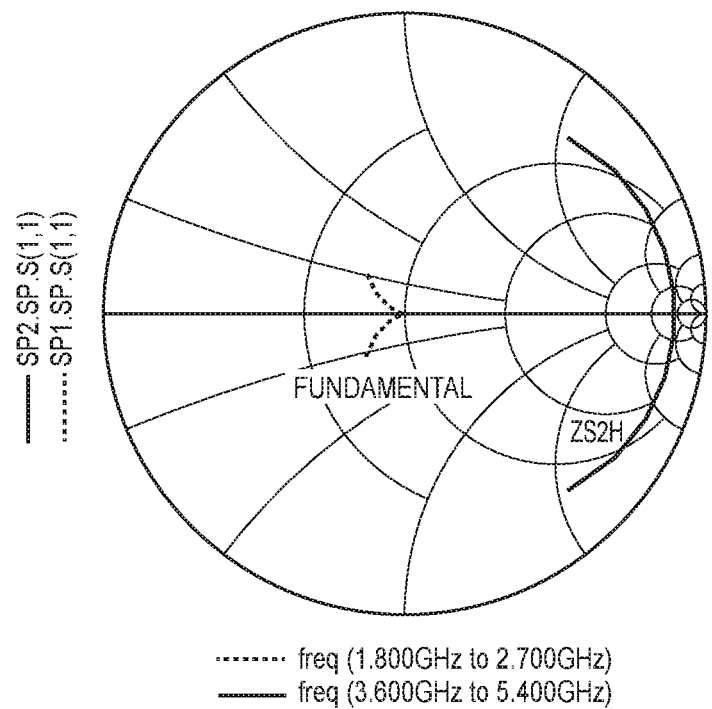
FIG. 7A is a Smith chart plotting the frequency response of the circuit of FIG. 4A over a second frequency range wider than the first, in terms of reflection coefficients.
Figure 7B:
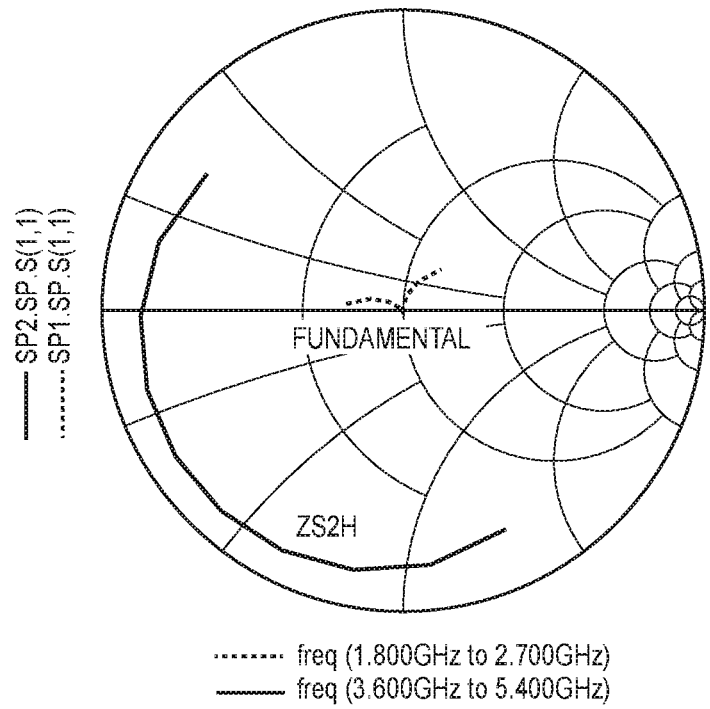
FIG. 7B is a Smith chart plotting the frequency response of the circuit of FIG. 5A over the second frequency range, in terms of reflection coefficients.
Figure 8A:
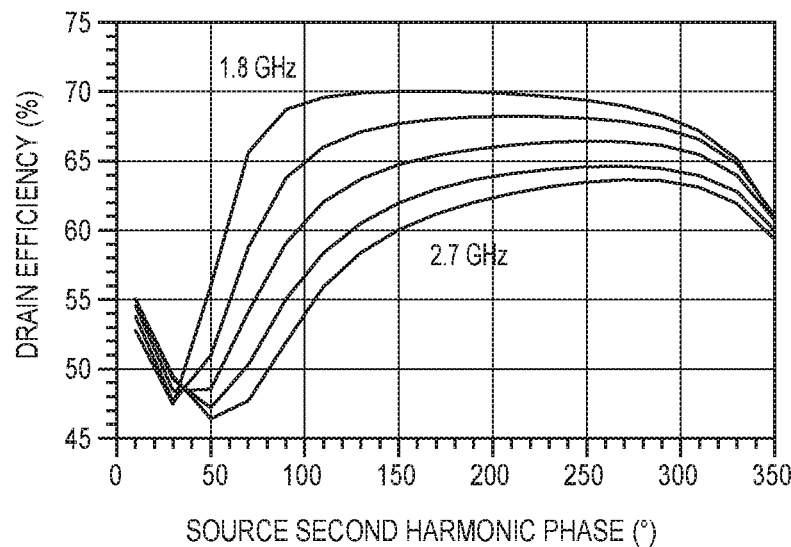
FIG. 8A is a graph of drain efficiency as a function of source second harmonic reflection coefficients over the second frequency range.
Figure 8B:
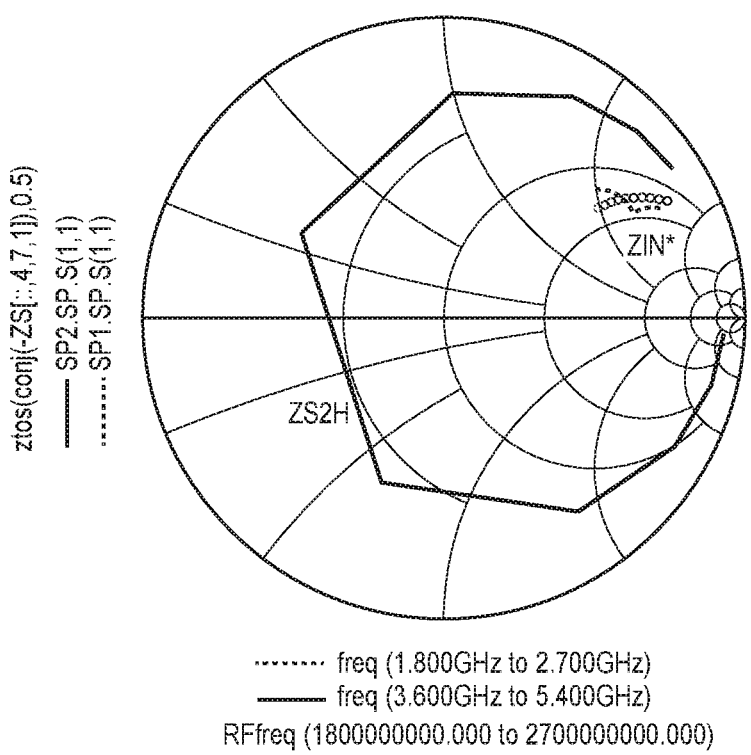
FIG. 8B is a Smith chart plotting the frequency response of the circuit of FIG. 6A over the second frequency range, in terms of reflection coefficients.

The second harmonic reflection coefficient phases can be located within a certain frequency range, depending on the matching network element values. For example, the frequency responses of FIGS. 4, 5 and 6 are plotted from 2.1 GHz to 2.7 GHz. However, when the design frequency is extended to the wider bandwidth from 1.8-2.7 GHz, then the frequency response of the network is more dispersive, as depicted in FIGS. 7A (BMN) and 7B (BMN+phase shifter). FIG. 8B plots the second harmonic reflection coefficient phases of the multi-stage impedance matching network presented to the amplifier in this extended frequency range. These are beyond the high performance region of FIG. 8A.

Figure 9A:
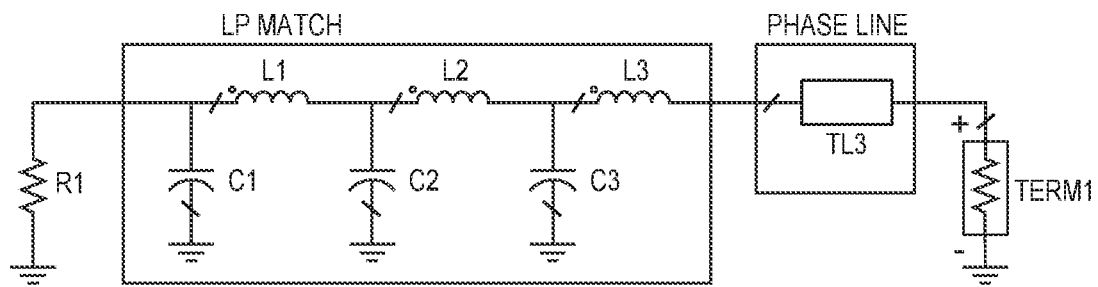
FIG. 9A is a block diagram of a multi-stage impedance matching network implemented as a low-pass type broadband matching network LPMN with a phase shifter.
Figure 9B:
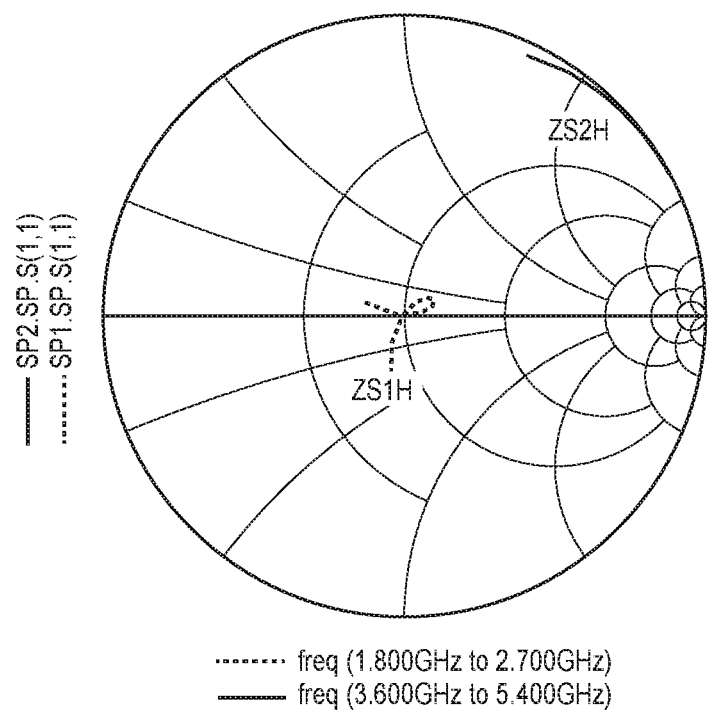
FIG. 9B is a Smith chart plotting the frequency response of the LPMN of FIG. 9A over the second frequency range, in terms of reflection coefficients.
Figure 9C:
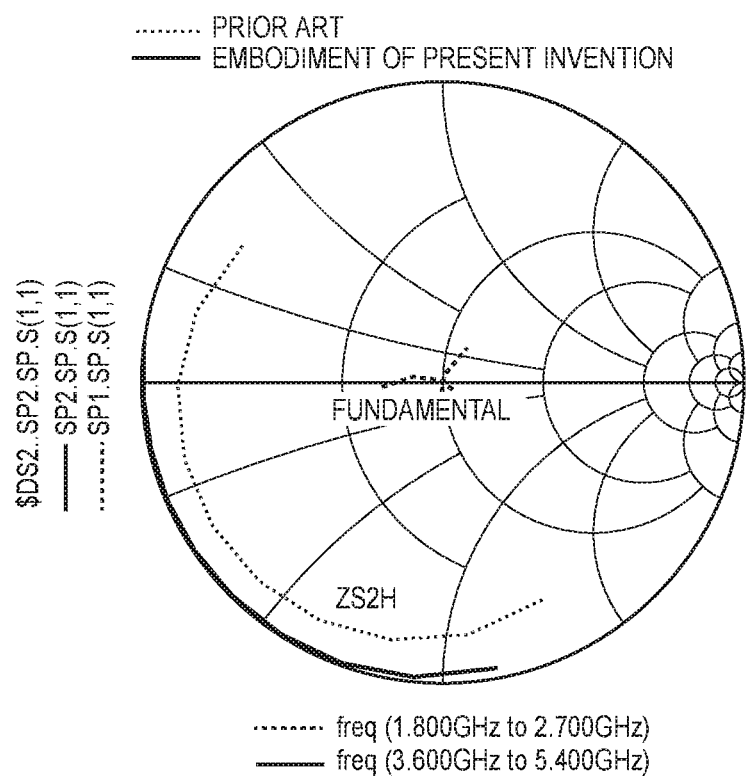
FIG. 9C is a Smith chart plotting the frequency response of the circuit of FIG. 9A (LPMN+phase shifter) over the second frequency range, in terms of reflection coefficients.

The inventors have discovered that use of a low-pass type broadband multiple stage matching network (LPMN), as depicted in FIG. 9A, exhibits less frequency dispersion when amplifying a wider frequency band. The frequency response of the low-pass type broadband matching network alone, as seen from the amplifier input, is depicted in FIG. 9B. The low-pass type broadband matching network LPMN provides low reflection at the fundamental frequency band, as shown in FIG. 9B by the line labeled ZS1H. As shown by the line labeled ZS2H, the low-pass type broadband matching network LPMN provides high reflection at the second harmonic frequency band. The second harmonic reflection phases are less dispersive, as compared to the BMN (see FIG. 7A), with higher magnitude which can result in higher performance. The frequency response of the LPMN together with the phase shifter is depicted in FIG. 9C, which also plots the response of the prior art BMN circuit (FIG. 6A) for comparison.

Figure 9D:
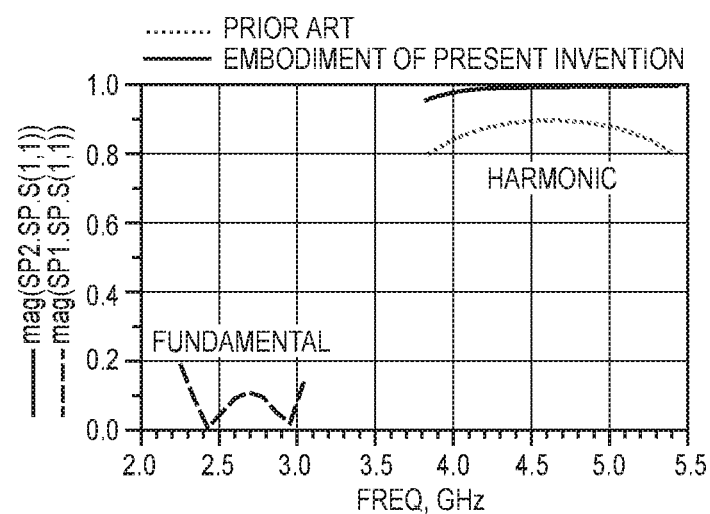
FIG. 9D is a graph of the magnitudes of reflection coefficients at the fundamental and second harmonic frequencies for the circuits of FIGS. 6A (BMN) and 9A (LPMN).

FIG. 9D depicts the reflection coefficients magnitude of the LPMN and phase shifter. The fundamental frequency response exhibits two local minima, at 2.0 and 2.6 GHz, with maxima of less than 0.2 at 1.8 GHz and 2.7 GHz. The reflection coefficients at the second harmonic are very high, near or at 1.0 across the range from approximately 4-5.4 GHz. For comparison, the reflection coefficients of the BMN circuit of FIG. 6A are also plotted. These range from 0.8 to 0.9 across the second harmonic frequency band (dotted line). These graphs demonstrate lower frequency dispersion, with higher reflection magnitude, for the LPMN circuit over the BMN, which translates to higher performance broadband operation.

With the BMN, the magnitude of the reflection coefficient at the second harmonic frequency range is primarily determined by the difference between the system impedance and the low impedance. In contrast, with the LPMN, the magnitude of the reflection coefficients at the second harmonic frequency range is determined by the order of the low-pass type broadband matching network and its loss.

Figure 10A:
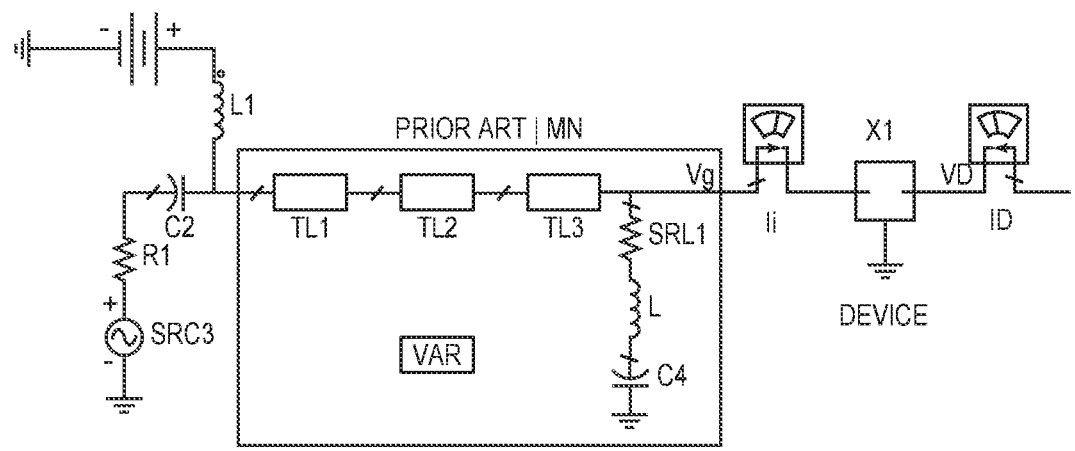
FIG. 10A is a diagram of a simulation of the circuit of FIG. 6A.
Figure 10B:
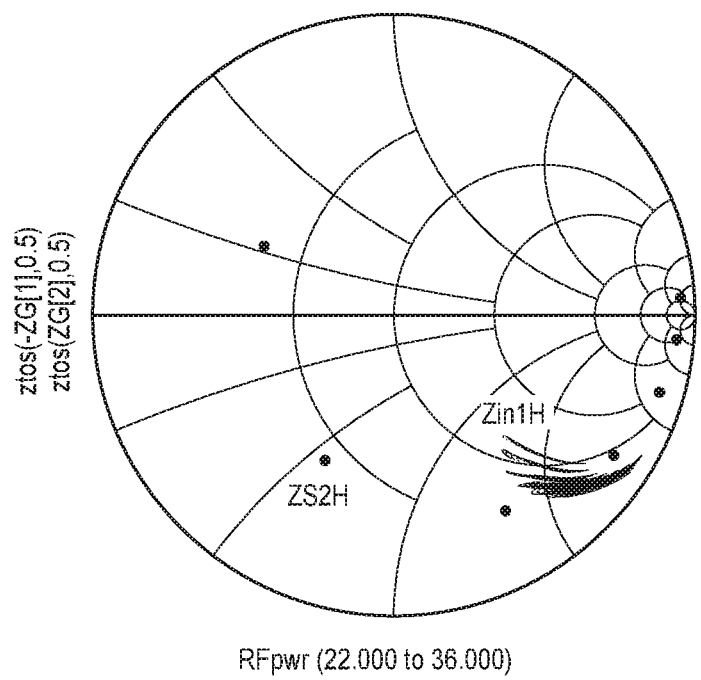
FIG. 10B is a Smith chart plotting the frequency response of the circuit of FIG. 10A over the first frequency range, in terms of reflection coefficients.
Figure 10C:
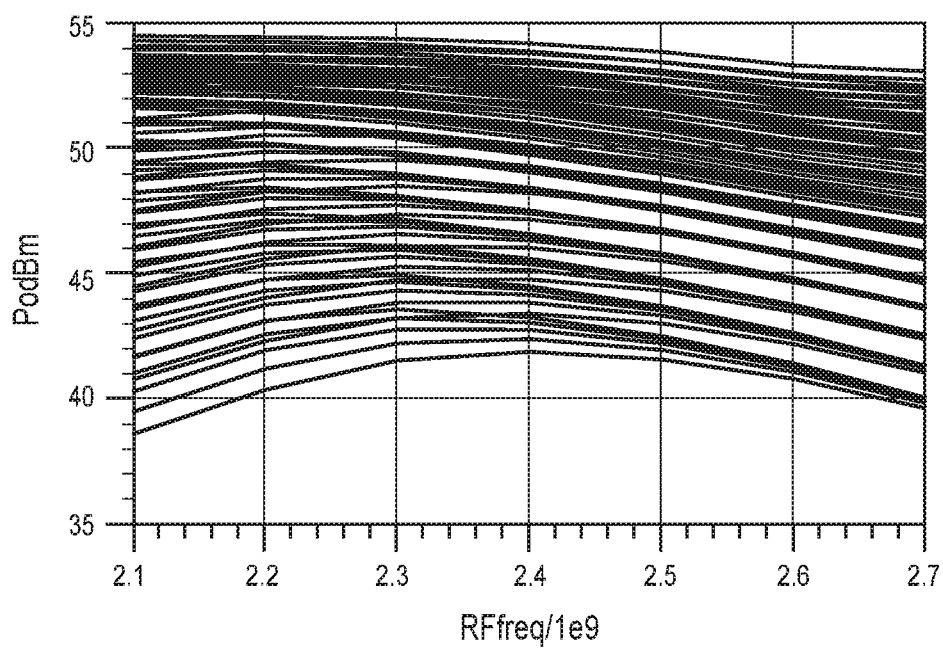
FIG. 10C is a graph of the simulated output power of the circuit of FIG. 10A over the first frequency range.
Figure 10D:
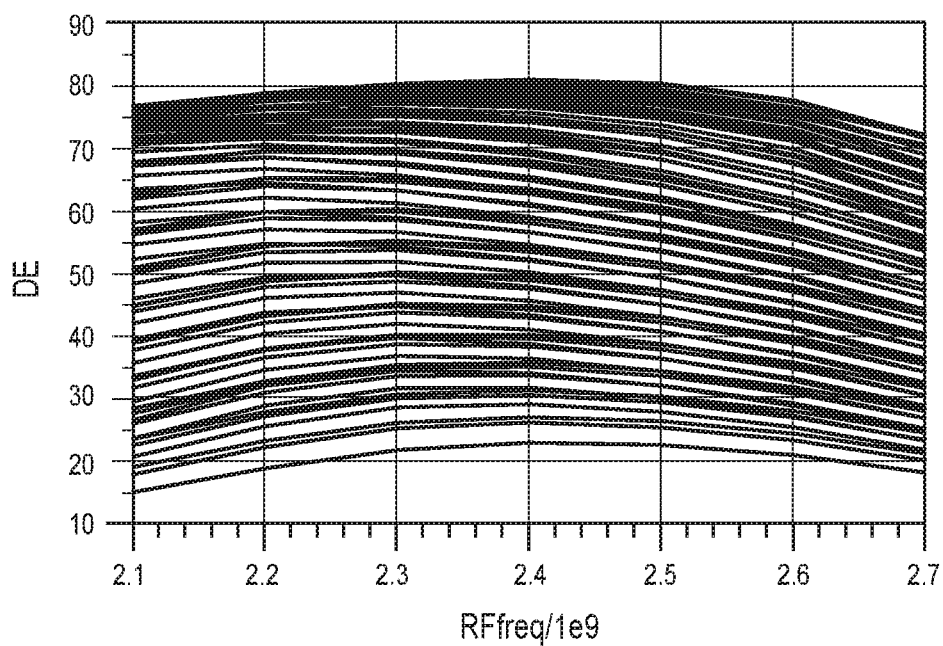
FIG. 10D is a graph of the simulated drain efficiency of the circuit of FIG. 10A over the first frequency range.

Embodiments of the present invention were simulated using a commercial nonlinear simulator using harmonic balance simulation with a nonlinear device model. The performance of a multi-stage impedance matching network using a LPMN is compared to that of one using a BMN in same frequency range. First the impedance matching network with a BMN was applied to a nonlinear model with class-B bias as depicted in FIG. 10A. The input power and loads were swept versus frequency, over a first frequency range from 2.1 GHz to 2.7 GHz. FIG. 10B plots the fundamental device input impedances (Zin1H) and the source second harmonic impedances (dots, labeled ZS2H) presented to the device. The simulated output power versus frequency is plotted in FIG. 10C, and the drain efficiencies are plotted in FIG. 10D.

Figure 11A:
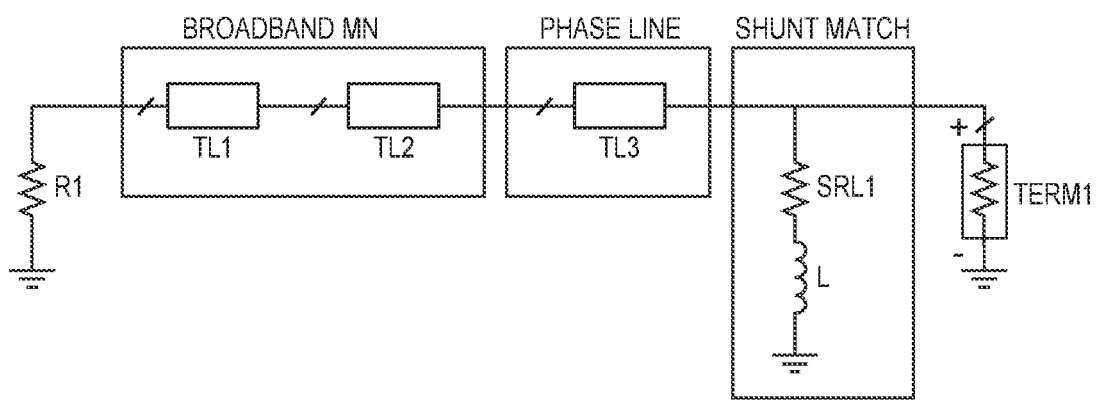
FIG. 11A is a diagram of a simulation of the circuit of FIG. 6A.
Figure 11B:
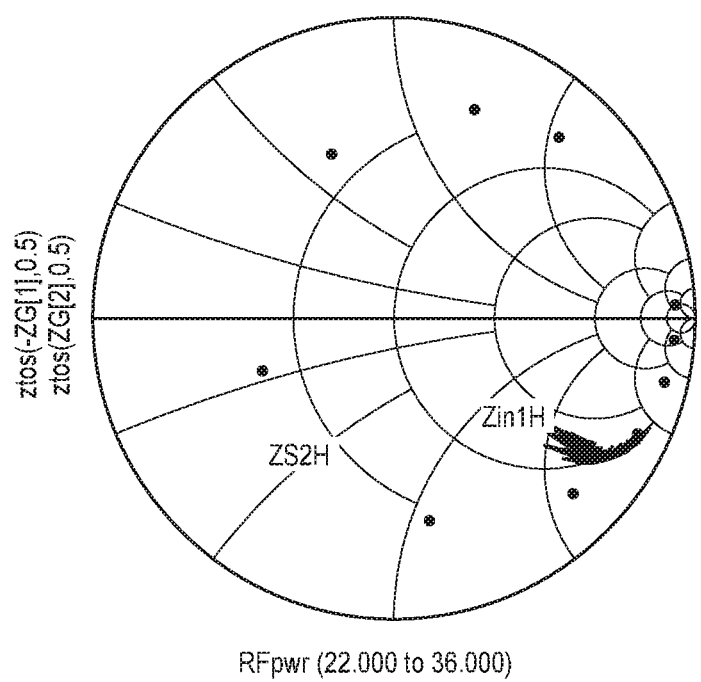
FIG. 11B is a Smith chart plotting the frequency response of the circuit of FIG. 11A over a second frequency range, wider than the first frequency range, in terms of reflection coefficients.
Figure 11C:
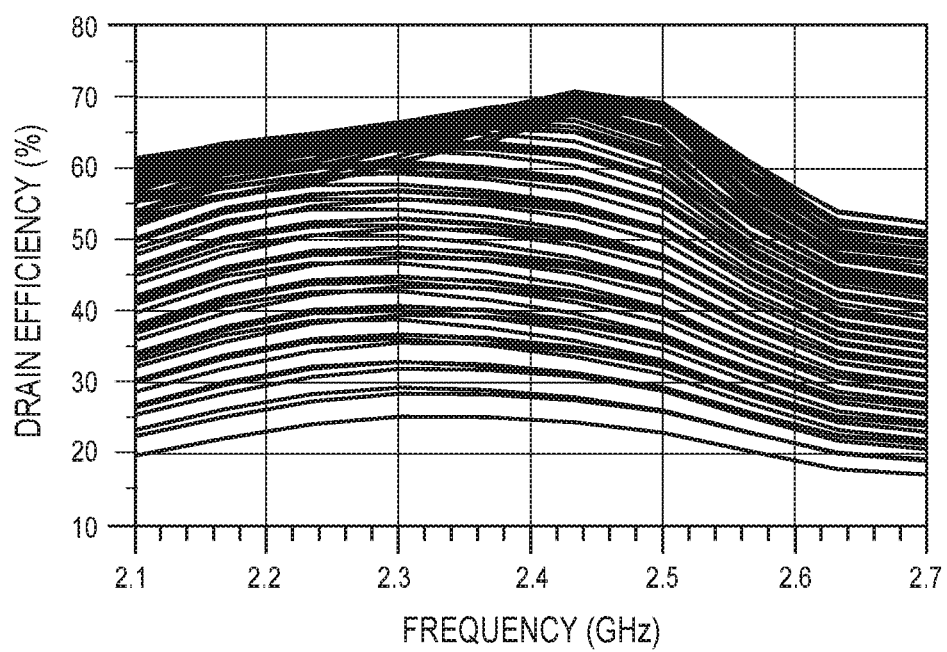
FIG. 11C is a graph of the simulated drain efficiency of the circuit of FIG. 11A over the second frequency range.

The simulation was then extended to a second frequency range of 1.8-2.7 GHz (i.e., wider than the first frequency range) for the circuit of FIG. 11A. FIG. 11B plots the fundamental (Zin1H) and second harmonic (ZS2H) impedances, which clearly show wider dispersion, as compared to FIG. 10B. As a result, the drain efficiency plotted in FIG. 11C shows fluctuation (as expected; see FIG. 8A).

Figure 12A:
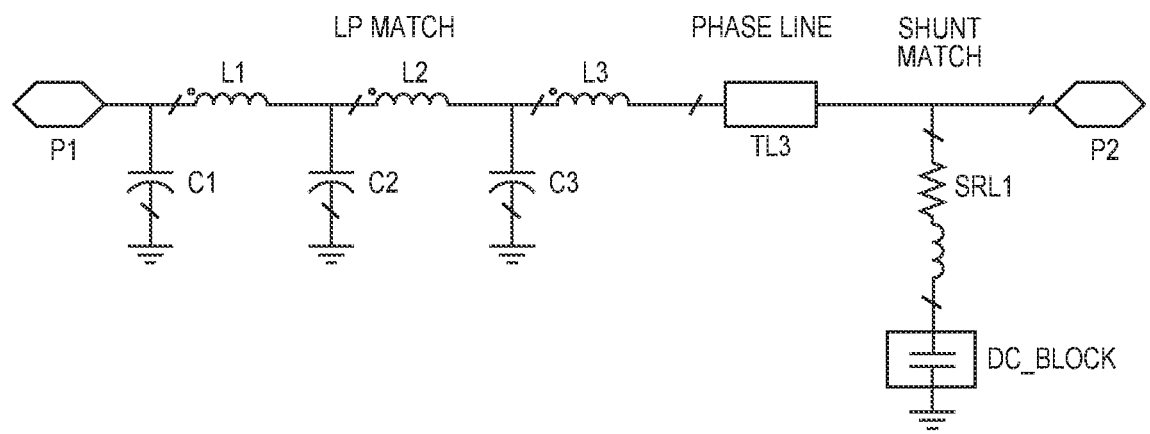
FIG. 12A is a diagram of a simulation of the circuit of FIG. 9A, using a LPMN implemented as lumped elements.
Figure 12B:
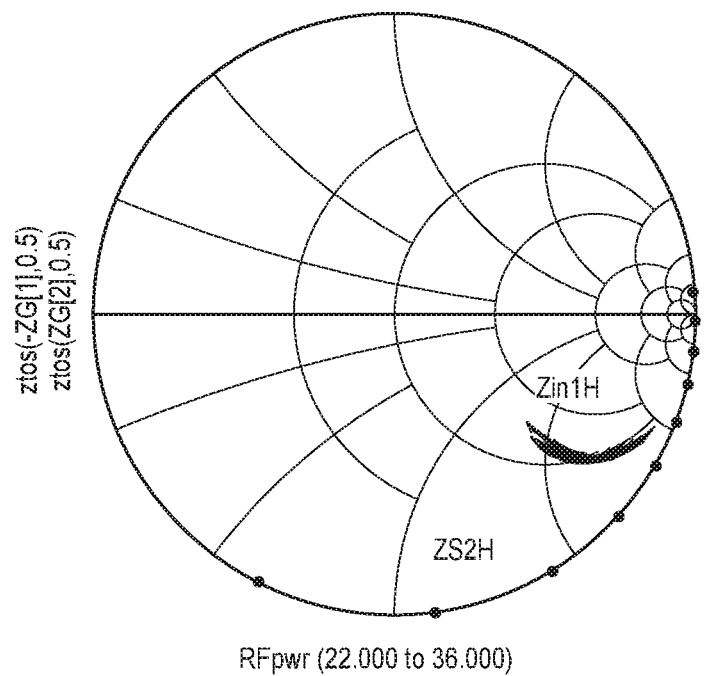
FIG. 12B is a Smith chart plotting the frequency response of the circuit of FIG. 12A over the second frequency range, in terms of reflection coefficients.
Figure 12C:
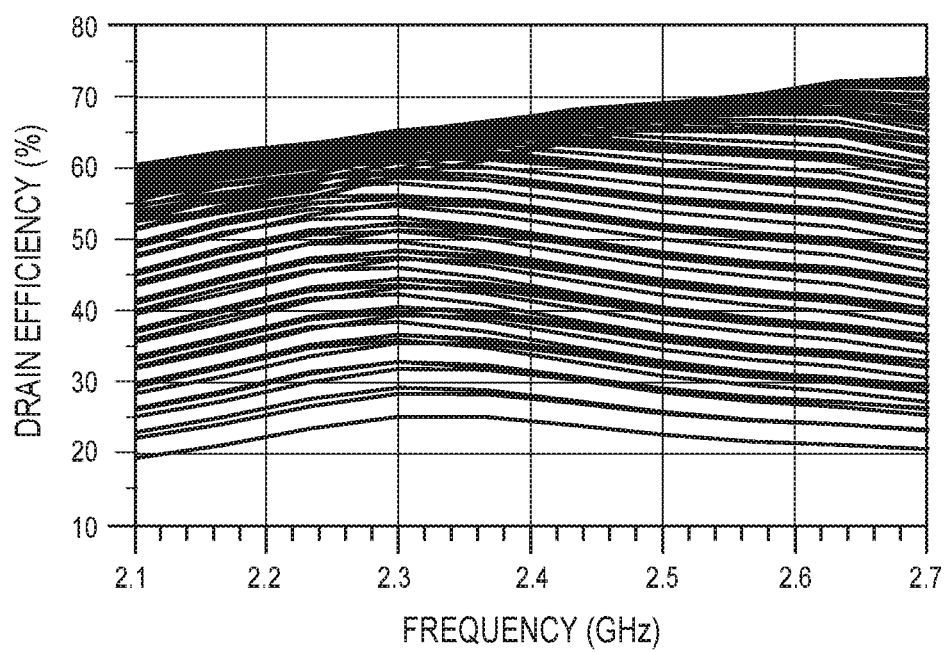
FIG. 12C is a graph of the simulated drain efficiency of the circuit of FIG. 12A over the second frequency range.

Next, the inventive multi-stage impedance matching network using a LPMN, implemented using lumped inductances and capacitances, as depicted in FIG. 12A, was simulated over the second frequency range (1.8-2.7 GHz). As depicted in FIG. 12B, the fundamental (Zin1H) impedances are similar to those in FIG. 11A, but the second harmonic reflection coefficients (dots, labeled ZS2H) show less frequency dispersion. Additionally, the drain efficiency, as plotted in FIG. 12C, shows less fluctuation versus frequency than that depicted in FIG. 11C.

Figure 13A:
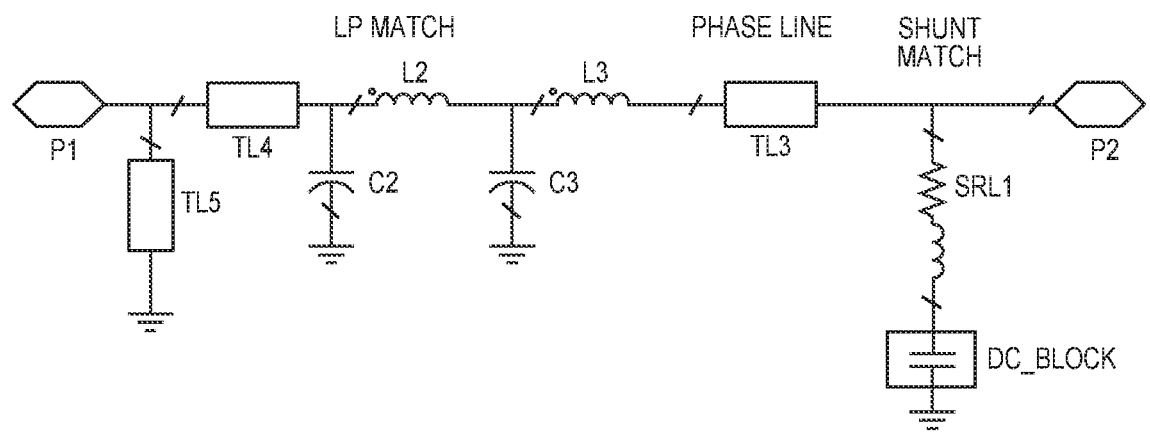
FIG. 13A is a diagram of a simulation of the circuit of FIG. 9A, using part of a LPMN implemented as distributed elements.
Figure 13B:
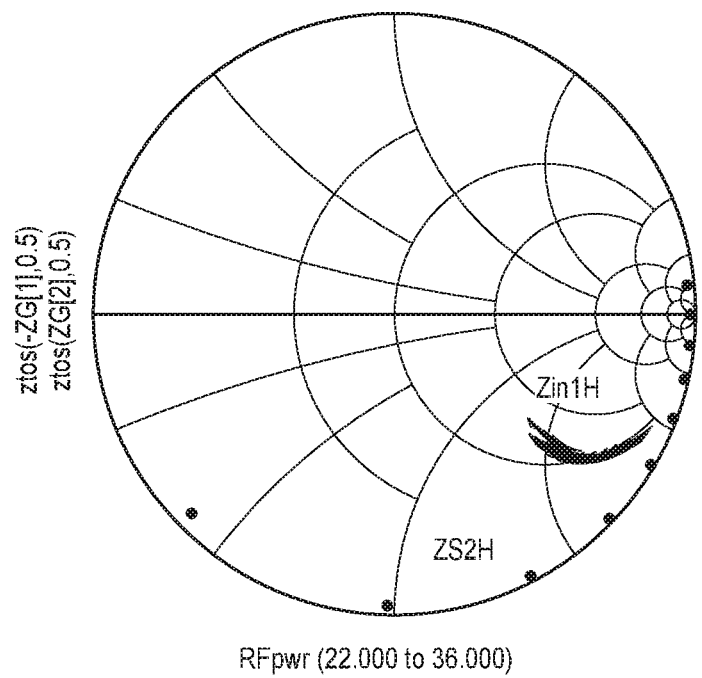
FIG. 13B is a Smith chart plotting the frequency response of the circuit of FIG. 13A over the second frequency range, in terms of reflection coefficients.
Figure 13C:
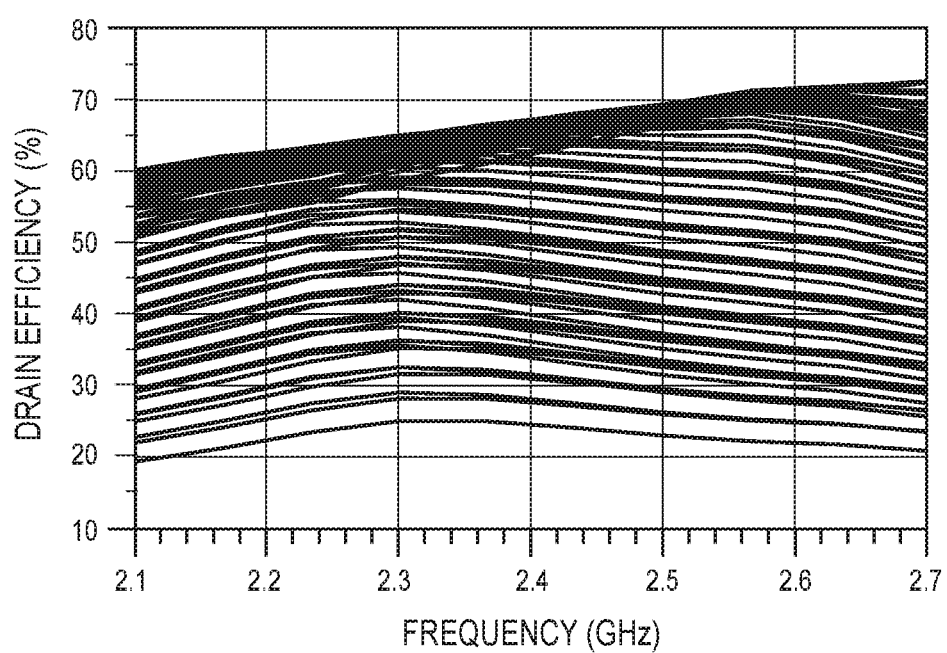
FIG. 13C is a graph of the simulated drain efficiency of the circuit of FIG. 13A over the second frequency range.

In one embodiment, the low-pass type broadband matching network LPMN is implemented using distributed elements in at least some parts, as depicted in FIG. 13A. This design was also simulated. It shows similar performance to the lumped element embodiment of FIG. 12A, as depicted in the Smith chart plot of FIG. 13B, and the drain efficiency versus frequency graph of FIG. 13C. Therefore, the low-pass type broadband matching network LPMN can be implemented using lumped or distributed elements, or various combinations.

Figure 14:
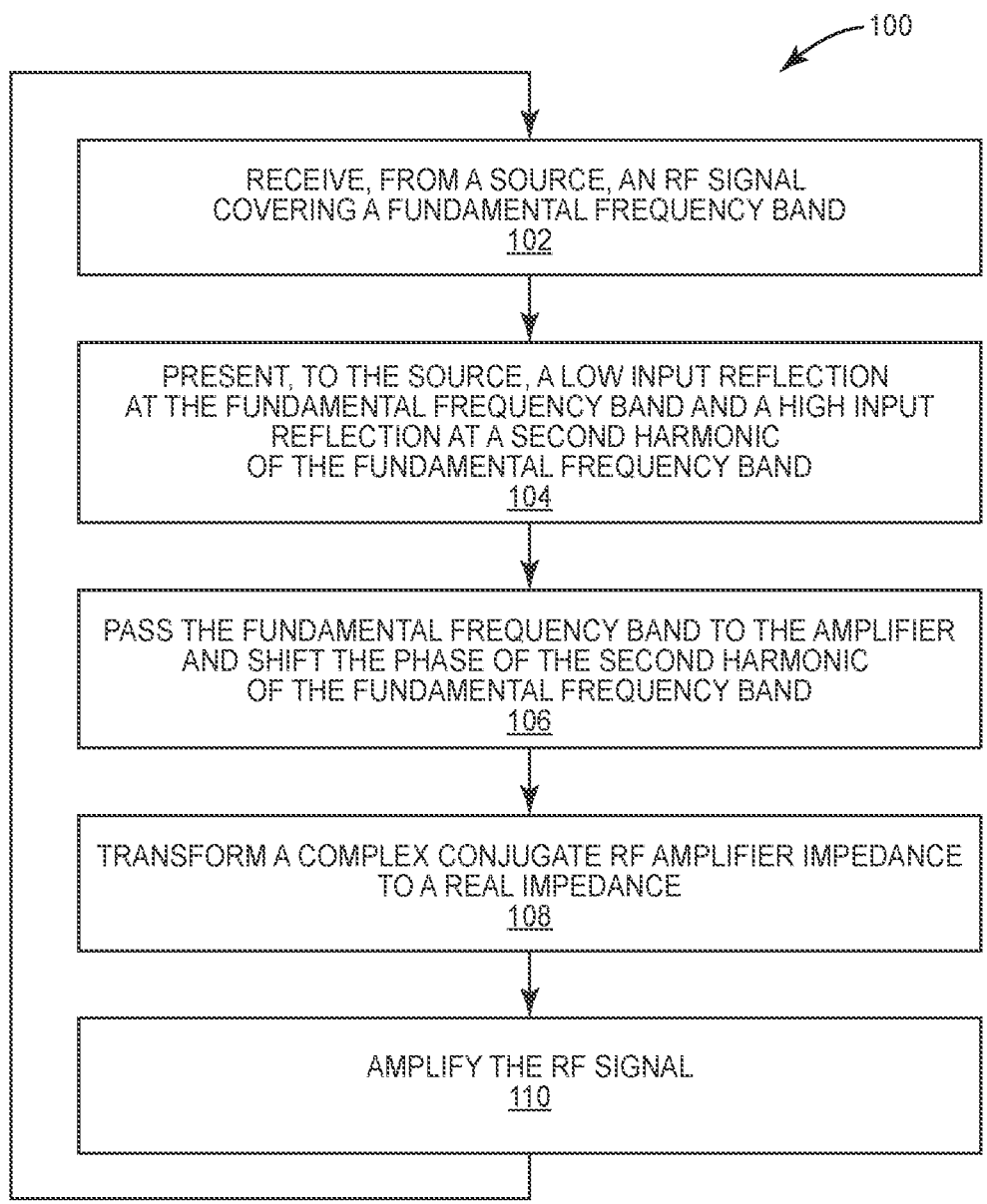
FIG. 14 is a flow diagram of a method of operating a broadband RF amplifier having a multi-stage impedance matching network, including a low-pass type broadband matching network LPMN, at its input.

FIG. 14 depicts a method 100 of operating a broadband RF amplifier. The RF amplifier includes multi-stage impedance matching network, including a low-pass type broadband matching network LPMN, at its input. Although depicted in discrete, sequential steps, those of skill in the art will recognize that the method 100 is continuously performed as long as the broadband RF amplifier is in operation. An RF signal to be amplified is received by the multi-stage impedance matching network from a source, such as a DSP or processing circuitry of a wireless communication network base station (block 102). The RF signal covers a fundamental frequency band. A low input reflection at the fundamental frequency band, and a high input reflection at a second harmonic of the fundamental frequency band, is presented back to the source by the LPMN (block 104). The fundamental frequency band is passed to the amplifier, and the phase of the second harmonic of the fundamental frequency band is shifted by a phase shifter (block 106). For example, the second harmonic may be shifted to operate in an efficient region, as depicted in FIG. 1C or 8A. A complex conjugate RF amplifier impedance is transformed to a real impedance by a final matching network (block 108). The RF signal is then amplified by the RF amplifier. As depicted in FIGS. 12 and 13, use of the LPMN in the multi-stage impedance matching network results in superior performance over a wider frequency bandwidth than amplifier circuits of the prior art.

Although embodiments of the present invention have been described herein with respect to a multi-stage impedance matching network deployed at an input to an amplifier, the inventive multi-stage impedance matching network—including a low-pass type broadband matching network—may also advantageously be used for matching impedance at the output of an amplifier. In this case, the order of the three components would be the reverse, or "mirror image," of the circuits describe above. In particular, in an effective multi-stage impedance matching network applied at the output of an amplifier, an impedance matching circuit would be connected to the amplifier output. A phase shifting circuit would be connected to the matching network. Finally, a low-pass type broadband matching network would be connected to the phase shifting circuit. In both cases (i.e., input and output), the phase shifting circuit is interposed between the low-pass type broadband matching network connected to the system, and the impedance matching circuit connected to the amplifier.

Figure 15:
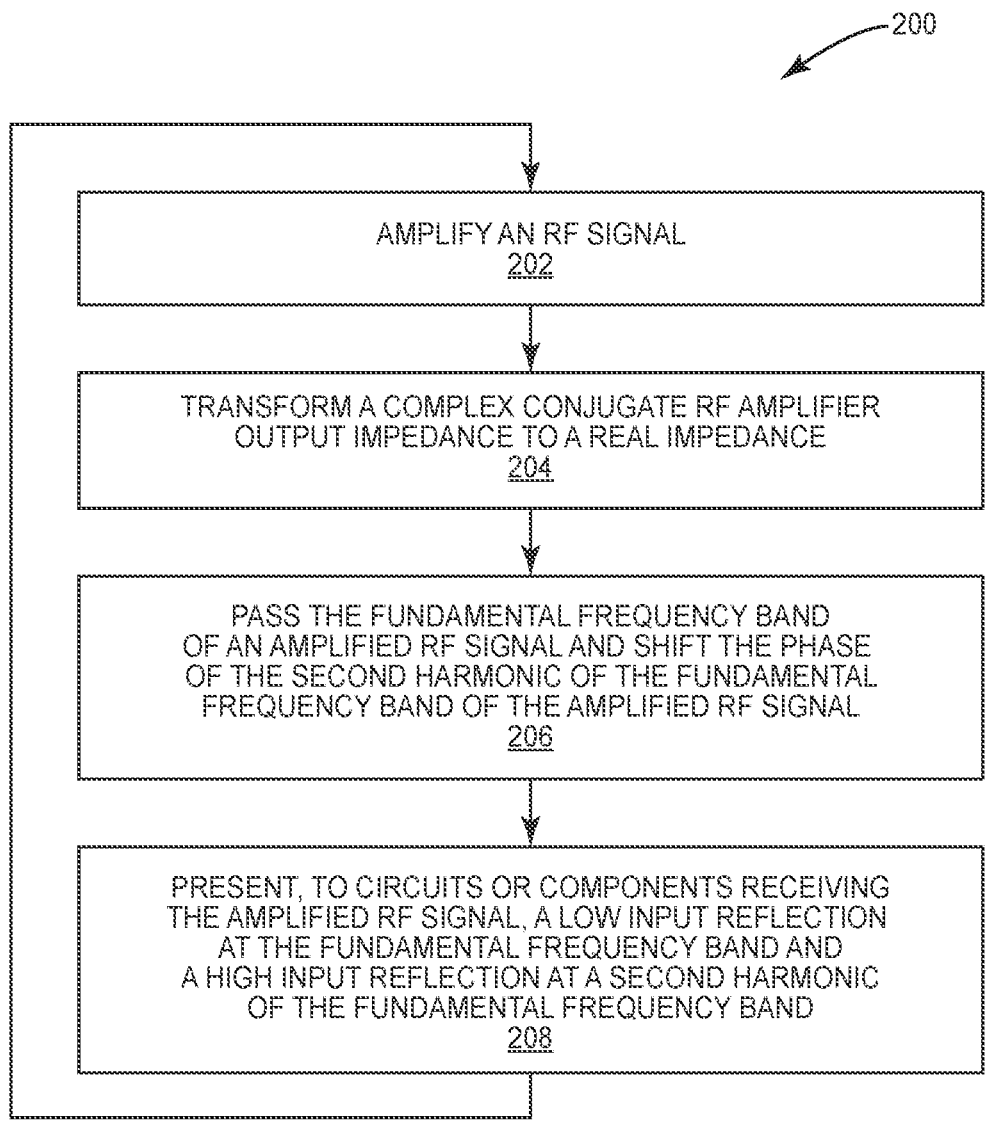
FIG. 15 is a flow diagram of a method of operating a broadband RF amplifier having a multi-stage impedance matching network, including a low-pass type broadband matching network LPMN, at its output.

FIG. 15 depicts a method 200 of operating a broadband RF amplifier, with a multi-stage impedance matching network, including a low-pass type broadband matching network LPMN, at its output. Although depicted in discrete, sequential steps, those of skill in the art will recognize that the method 200 is continuously performed as long as the broadband RF amplifier is in operation. An RF signal is amplified (block 202). A complex conjugate RF amplifier output impedance is transformed to a real impedance by a matching network (block 204). The fundamental frequency band of the amplified RF signal is passed, and the phase of the second harmonic of the fundamental frequency band is shifted by a phase shifter (block 206). A low input reflection at the fundamental frequency band, and a high input reflection at a second harmonic of the fundamental frequency band, is presented to downstream components or circuits by the LPMN (block 208).

Embodiments of the present invention present numerous advantages over the prior art. As discussed above, the magnitude of the reflection coefficients at the second harmonic frequency range for the prior art broadband matching network BMN is primarily determined by the difference between the system impedance and the low impedance. In the case of embodiments of the inventive low-pass broadband matching network LPMN, the magnitude of the reflection coefficients at the second harmonic frequency range is determined by the order of the low-pass type broadband matching network and its loss. By proper design of the LPMN, superior reflection of second harmonic components of a broadband RF signal is achieved, resulting in improved performance of the RF amplifier.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A broadband Radio Frequency (RF) amplifier circuit configured to amplify an RF signal received from a source, across an RF frequency band that includes a fundamental frequency band, comprising:
    an amplifying circuit; and
    a multi-stage broadband impedance matching circuit at an input of the amplifying circuit, and comprising
        a low-pass broadband impedance matching network presenting a low input reflection to the RF source at the fundamental frequency band and a high input reflection to the RF source at a second harmonic of the fundamental frequency band;
        a phase shifting circuit configured to pass the RF signal at the fundamental frequency band, and to shift the phase of the RF signal at the second harmonic of the fundamental frequency band; and
        an impedance matching circuit configured to transform the complex conjugate amplifying circuit input impedance to a real impedance.

2. The RF amplifier circuit of claim 1 wherein the low-pass broadband impedance matching network transforms a system impedance of 50Ω to a characteristic impedance of the phase shifting circuit.

3. The RF amplifier circuit of claim 1 wherein the phase shifting circuit is connected between the low-pass broadband impedance matching network and the impedance matching circuit.

4. The RF amplifier circuit of claim 1 wherein the low-pass broadband impedance matching network comprises, at least in part, distributed inductances and capacitances.

5. The RF amplifier circuit of claim 1 wherein the low-pass broadband impedance matching network comprises, at least in part, lumped inductors and capacitors.

6. The RF amplifier circuit of claim 1 wherein the phase shifting circuit comprises a transmission line.

7. The RF amplifier circuit of claim 1 wherein the phase shifting circuit comprises lumped element version of a transmission like with a predetermined cut-off frequency.

8. The RF amplifier circuit of claim 1 wherein the impedance matching circuit is a high-pass impedance matching circuit.

9. The RF amplifier circuit of claim 1 wherein the high-pass impedance matching circuit comprises a shunt inductor.

10. The RF amplifier of claim 1 further comprising a multi-stage broadband impedance matching circuit at an output of the amplifying circuit, and comprising:

an impedance matching circuit connected to the output of the amplifying circuit and configured to transform a complex conjugate amplifying circuit input impedance to a real impedance;

a phase shifting circuit configured to pass the amplified RF signal at the fundamental frequency band, and to shift the phase of the amplified RF signal at the second harmonic of the fundamental frequency band; and a low-pass broadband impedance matching network presenting a low input reflection at the fundamental frequency band and a high input reflection at a second harmonic of the fundamental frequency band.

11. A broadband Radio Frequency (RF) amplifier circuit configured to amplify an RF signal across an RF frequency band that includes a fundamental frequency band, and to output an amplified RF signal, comprising:

an amplifying circuit; and a multi-stage broadband impedance matching circuit at an output of the amplifying circuit, and comprising an impedance matching circuit connected to the output of the amplifying circuit and configured to transform a complex conjugate amplifying circuit input impedance to a real impedance;

a phase shifting circuit configured to pass the amplified RF signal at the fundamental frequency band, and to shift the phase of the amplified RF signal at the second harmonic of the fundamental frequency band; and a low-pass broadband impedance matching network presenting a low input reflection at the fundamental frequency band and a high input reflection at a second harmonic of the fundamental frequency band.

12. The RF amplifier circuit of claim 11 wherein the RF amplifier circuit receives an RF signal from a source, and further comprising a multi-stage broadband impedance matching circuit at an input of the amplifying circuit, the multi-stage broadband impedance matching circuit comprising:

a low-pass broadband impedance matching network presenting a low input reflection to the RF source at the fundamental frequency band and a high input reflection to the RF source at a second harmonic of the fundamental frequency band;

a phase shifting circuit configured to pass the RF signal at the fundamental frequency band, and to shift the phase of the RF signal at the second harmonic of the fundamental frequency band; and an impedance matching circuit configured to transform the complex conjugate amplifying circuit input impedance to a real impedance.

13. A multi-stage broadband impedance matching circuit for a broadband Radio Frequency (RF) amplifier operative across an RF frequency band that includes a fundamental frequency band, comprising:

a low-pass broadband impedance matching network presenting a low input reflection at the fundamental frequency band and a high input reflection at a second harmonic of the fundamental frequency band;

a phase shifting circuit configured to pass an RF signal at the fundamental frequency band, and to shift the phase of the RF signal at the second harmonic of the fundamental frequency band; and an impedance matching circuit configured to transform a complex conjugate device impedance to a real impedance.

14. The Impedance matching circuit of claim 13 wherein the low-pass broadband impedance matching network transforms a system impedance of 50Ω to a characteristic impedance of the phase shifting circuit.

15. The Impedance matching circuit of claim 13 wherein the phase shifting circuit is connected between the low-pass broadband impedance matching network and the impedance matching circuit.

16. The Impedance matching circuit of claim 13 wherein the low-pass broadband impedance matching network comprises, at least in part, distributed inductances and capacitances.

17. The Impedance matching circuit of claim 13 wherein the low-pass broadband impedance matching network comprises, at least in part, lumped inductors and capacitors.

18. The Impedance matching circuit of claim 13 wherein the phase shifting circuit comprises a transmission line.

19. A method of operating a broadband Radio Frequency (RF) amplifier, comprising:

receiving, from a source, an RF signal to be amplified, the RF signal covering a fundamental frequency band;

presenting, to the source, a low input reflection at the fundamental frequency band and a high input reflection at a second harmonic of the fundamental frequency band;

passing the fundamental frequency band and shifting the phase of the second harmonic of the fundamental frequency band;

transforming a complex conjugate RF amplifier impedance to a real impedance; and amplifying the RF signal.

20. The method of claim 19 further comprising:

transforming a complex conjugate RF amplifier output impedance to a real impedance;

passing the fundamental frequency band of an amplified RF signal and shifting the phase of the second harmonic of the fundamental frequency band of the amplified RF signal; and presenting, to circuits or components receiving the amplified RF signal, a low input reflection at the fundamental frequency band and a high input reflection at a second harmonic of the fundamental frequency band.

21. A method of operating a broadband Radio Frequency (RF) amplifier, comprising:

amplifying an RF signal;

transforming a complex conjugate RF amplifier output impedance to a real impedance;

passing the fundamental frequency band of an amplified RF signal and shifting the phase of the second harmonic of the fundamental frequency band of the amplified RF signal; and presenting, to circuits or components receiving the amplified RF signal, a low input reflection at the fundamental frequency band and a high input reflection at a second harmonic of the fundamental frequency band.

22. The method of claim 21 further comprising:

receiving, from a source, an RF signal to be amplified, the RF signal covering a fundamental frequency band;

presenting, to the source, a low input reflection at the fundamental frequency band and a high input reflection at a second harmonic of the fundamental frequency band;

passing the fundamental frequency band and shifting the phase of the second harmonic of the fundamental frequency band;
transforming a complex conjugate RF amplifier impedance to a real impedance; and
amplifying the RF signal.

* * * * *